(12) United States Patent  (10) Patent No.: US 9,297,998 B2
Novoselov et al.  (45) Date of Patent: Mar. 29, 2016

(54) ELECTRODE OF AN ELECTROWETTING DEVICE

(71) Applicant: Amazon Technologies, Inc., Reno, NV (US)

(72) Inventors: Pavel Novoselov, Eindhoven (NL); Sukhdip Sandhu, Eindhoven (NL)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 14/229,139

(22) Filed: Mar. 28, 2014

(65) Prior Publication Data

US 2015/0277101 A1 Oct. 1, 2015

(51) Int. Cl.
*G02B 26/00* (2006.01)
*G02B 26/02* (2006.01)
*H01L 29/06* (2006.01)
*H01L 21/28* (2006.01)
(Continued)

(52) U.S. Cl.
CPC ............ *G02B 26/005* (2013.01); *G02B 26/004* (2013.01); *G09G 3/348* (2013.01); *H01L 21/28* (2013.01); *B01L 3/502784* (2013.01); *B01L 3/502792* (2013.01); *B01L 2400/04* (2013.01); *B01L 2400/0427* (2013.01); *C23C 16/407* (2013.01); *G02F 2202/10* (2013.01); *H01L 29/06* (2013.01); *H01L 29/08* (2013.01); *H01L 29/7869* (2013.01); *H01L 51/0002* (2013.01); *H01L 51/5203* (2013.01)

(58) Field of Classification Search
CPC ...... G02B 26/00; G02B 26/02; G02B 26/004; G02B 26/005; G09G 3/34; G09G 3/348; G02F 2202/00; G02F 2202/10; B01L 3/502784; B01L 3/502792; B01L 2400/00; B01L 2400/04; B01L 2400/0427; H01L 27/1214; H01L 27/1225; H01L 29/06; H01L 29/08; H01L 21/20; H01L 45/00; H01L 45/04; H01L 45/1253; H01L 51/0094; H01L 51/0558; H01L 51/5203
USPC ................. 359/290, 291, 295, 228, 245, 253; 257/40, 43, 57, 59, 258, E51.001, 257/E51.003, E51.005, E51.006, E33.053; 438/104, 458; 204/547, 643
See application file for complete search history.

(56) References Cited

U.S. PATENT DOCUMENTS 6,191,007 B1 * 2/2001 Matsui et al. ................. 438/459
7,460,289 B2 * 12/2008 Pichot et al. ................. 359/265
(Continued)

FOREIGN PATENT DOCUMENTS

EP 0348209 A2 12/1989
EP 1986023 A1 10/2008
(Continued)

OTHER PUBLICATIONS

International Search Report for International Application No. PCT/EP2015/056794 mailed from the International Searching Authority on Jun. 26, 2015, 12 pages.

*Primary Examiner* — Loha Ben
(74) *Attorney, Agent, or Firm* — BainwoodHuang

(57) ABSTRACT

An electrowetting display device including an electrowetting element with a first support plate, a second support plate, a first fluid and a second fluid immiscible with the first fluid. A voltage may be applied between a first electrode and a second electrode. At least one of the first electrode and the second electrode comprises a semiconducting material.

20 Claims, 2 Drawing Sheets

(51) Int. Cl.
*G09G 3/34* (2006.01)
*H01L 51/00* (2006.01)
*H01L 51/52* (2006.01)
*H01L 29/08* (2006.01)
*H01L 29/786* (2006.01)
*C23C 16/40* (2006.01)
*B01L 3/00* (2006.01)

(56) References Cited

U.S. PATENT DOCUMENTS

| | | | | |
|---|---|---|---|---|
| 7,879,688 B2 * | 2/2011 | Novack | ............... | H01L 51/0537 257/E21.625 |
| 8,106,861 B2 * | 1/2012 | Lee | .................. | G02B 26/005 345/84 |
| 8,325,316 B2 * | 12/2012 | Lee | .................. | G02B 26/005 345/107 |
| 8,448,530 B2 * | 5/2013 | Leuenberger et al. | ... | 73/862.625 |
| 8,461,582 B2 * | 6/2013 | Kimura | ............ | 257/43 |
| 8,680,529 B2 * | 3/2014 | Kimura | ............ | H01L 27/1225 257/59 |
| 8,729,551 B2 * | 5/2014 | Roh et al. | ......... | 257/59 |
| 8,902,489 B2 * | 12/2014 | Yang | ............ | G02B 26/005 359/290 |
| 2013/0271817 A1 | 10/2013 | Jung et al. | | |
| 2015/0077833 A1 * | 3/2015 | Yang | ............ | G02B 26/005 359/290 |

FOREIGN PATENT DOCUMENTS

| | | |
|---|---|---|
| WO | 2009071694 A2 | 6/2009 |
| WO | 2013050515 A2 | 4/2013 |
| WO | 2013116675 A1 | 8/2013 |

* cited by examiner

ELECTRODE OF AN ELECTROWETTING DEVICE

BACKGROUND

Electrowetting display devices are known. In an off state of an electrowetting element of an example of such a device an oil layer covers a display area. In an on state the oil layer is retracted so as to cover less of the display area. To switch the element to the on state a voltage is applied via an electrode and an electrically conductive fluid immiscible with the oil. To switch the element to the off state, the voltage is switched off.

It is desirable to provide improvements to an electrowetting element, for example to improve a quality of switching performance.

DETAILED DESCRIPTION

Figure 1:
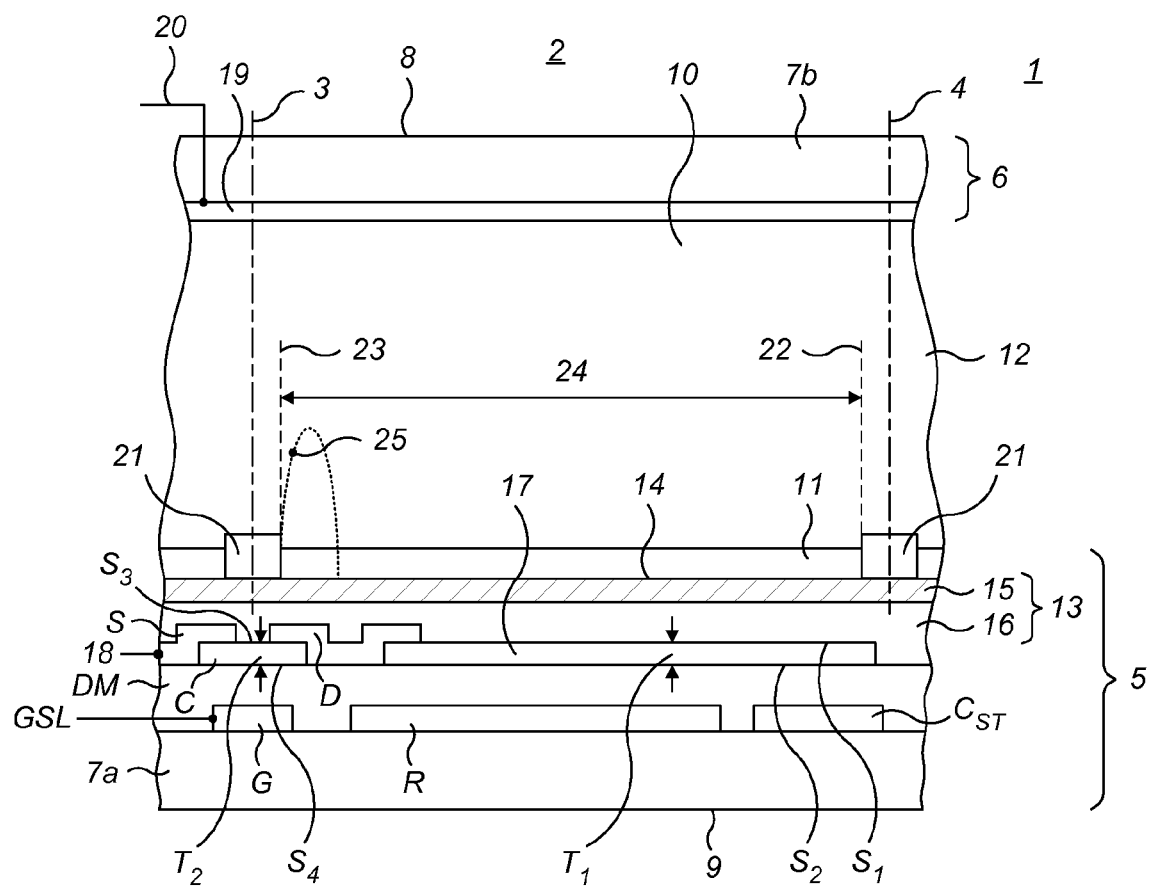
FIG. 1 shows schematically a cross section of an example picture element of an electrowetting display device.

FIG. 1 shows a diagrammatic cross-section of part of an example of an electrowetting display device 1, including a plurality of picture elements or display elements 2, one of which is shown in the Figure and which may also be referred to as an electrowetting cell or an electrowetting element. It is to be appreciated that other electrowetting elements in the device may be configured similarly to that shown in FIG. 1. The lateral extent of the display element is indicated in the Figure by two dashed lines 3, 4. The display elements comprise a first support plate 5 and a second support plate 6. The support plates may be separate parts of each display element, but the support plates may be shared in common by the plurality of display elements. The support plates may include a glass or polymer substrate 7a, 7b and may be rigid or flexible.

The display device has a viewing side 8 on which an image or display formed by the display device can be viewed and a rear side 9. In the Figure a surface of the first support plate 5, which surface is in this example a surface of the substrate 7a, defines the rear side 9; a surface of the second support plate 6, which surface is in this example a surface of the substrate 7b of the second support plate, defines the viewing side 8; alternatively, in other examples, a surface of the first support plate may define the viewing side. The display device may be of the reflective, transmissive or transflective type. The display device may be of a segmented display type in which the image may be built up of segments, each segment including several display elements. The display device may be an active matrix driven display device, as is known to the skilled person. The plurality of display elements may be monochrome. For a colour display device the display elements may be divided in groups, each group having a different colour; alternatively, an individual display element may be able to show different colours.

A space 10 between the support plates is filled with two fluids: a first fluid 11 and a second fluid 12 at least one of which may be a liquid. The first and second fluids are therefore disposed between the first and second support plates. The second fluid is immiscible with the first fluid. Therefore, the first fluid and the second fluid do not substantially mix with each other and in some examples do not mix with each other to any degree. The immiscibility of the first and second fluids is due to the properties of the first and second fluids, for example their chemical compositions; the first and second fluids tend to remain separated from each other, therefore tending not to mix together to form a homogeneous mixture of the first and second fluids. Due to this immiscibility, the first and second fluids meet each other at an interface which defines a boundary between the volume of the first fluid and the volume of the second fluid; this interface or boundary may be referred to as a meniscus. With the first and second fluids substantially not mixing with each other, it is envisaged in some examples that there may be some degree of mixing of the first and second fluids, but that this is considered negligible in that the majority of the volume of first fluid is not mixed with the majority of the volume of the second fluid The second fluid is electrically conductive or polar and may be water, or a salt solution such as a solution of potassium chloride in water. The second fluid may be considered an electrolyte. The second fluid may be transparent; it may instead be coloured, white, absorbing or reflecting. The first fluid is electrically non-conductive and may for instance be an alkane like hexadecane or may be an oil such as silicone oil.

The first fluid may absorb at least a part of the optical spectrum. The first fluid may be transmissive for a part of the optical spectrum, forming a colour filter. For this purpose the first fluid may be coloured by addition of pigment particles or a dye. Alternatively, the first fluid may be black, i.e. absorb substantially all parts of the optical spectrum, for example 90% or more of visible light incident on the first fluid, or reflecting. A reflective first fluid may reflect the entire visible spectrum, making the layer appear white, or part of it, making it have a colour.

The support plate 5 includes an insulating layer 13. The insulating layer may be transparent or reflective. The insulating layer 13 may extend between walls of a display element. To avoid short circuits between the second fluid 12 and electrodes arranged under the insulating layer, layers of the insulating layer may extend uninterrupted into a plurality of display elements 2, as shown in the Figure. The insulating layer has a surface 14 facing the space 10 of the display element 2 and which is adjoined at least partly by the first fluid. In this example the surface 14 is hydrophobic. The thickness of the insulating layer may be less than 2 micrometers and may be less than 1 micrometer.

The insulating layer may be a hydrophobic layer; alternatively, it may include a hydrophobic layer 15 for adjoining the first fluid (i.e. a fluid adjoinment layer) and a barrier layer 16 with predetermined dielectric properties, the hydrophobic layer 15 being nearer the space 10 than the barrier layer 16, as shown in the Figure. The hydrophobic layer is schematically illustrated in FIG. 1 and may be formed of Teflon® AF1600. The barrier layer 16 may have a thickness, taken in a direction perpendicular the plane of the substrate, between 50 nanometers and 500 nanometers and may be made of an inorganic material like silicon oxide or silicon nitride or a stack of these (for example, silicon oxide—silicon nitride—silicon oxide) or an organic material like polyimide or parylene. The barrier layer may comprise multiple layers having different dielectric constants. The hydrophobic layer may be formed of an amorphous fluoropolymer layer such as AF1600 or AF1601 (available from DuPont, 1007 Market St., Wilmington, Del., USA), Hyflon AD® (available from Solvay, Solvay SA, rue de Ransbeek, 310-B-1120 Brussels, Belgium), Cytop (available from AGC Chemicals Europe, Ltd, PO Box 4, York House, Hillhouse International, Thornton Cleveleys, Lancashire FY5

4QD, United Kingdom) or any other low surface energy polymer, for example. It is further envisaged that non-polymer materials may be used to form the hydrophobic layer. In further examples, given the material used for forming the first electrode 17 as explained below, the insulating layer may comprise only a hydrophobic layer, i.e. no separate barrier layer may be necessary; in such examples the fluid adjoinment layer is formed on the first electrode.

In an off state, where no voltage is applied between the first and second electrodes, described below, the hydrophobic character of the surface 14 causes the first fluid 11 to adhere preferentially to the insulating layer 13, since the first fluid has a higher, i.e. greater, wettability with respect to the surface of the insulating layer 13 than the second fluid 12. Wettability relates to the relative affinity of a fluid for the surface of a solid. Wettability may be measured by the contact angle between the fluid and the surface of the solid. The contact angle is determined by the difference in surface tension between the fluid and the solid at the fluid-solid boundary. For example, a high difference in surface tension can indicate hydrophobic properties.

Each display element 2 includes a first electrode 17 as part of the first support plate 5, i.e. the first electrode is located in the first support plate. In examples shown there is one such electrode 17 per element. The electrode 17 is separated from the fluids by the insulating layer 13; electrodes of neighbouring display elements are electrically isolated from each other by for example a non-conducting layer. In some examples, further layers may be arranged between the insulating layer 13 and the electrode 17. The electrode 17 can be of any desired shape or form.

In examples a switching element is used to control application of an electric potential to the first electrode 17 and therefore for controlling application of a voltage between the first and second electrodes of a display element. In examples to be described using FIG. 1, the switching element is a transistor such as a thin film transistor (TFT), which is located in the first support plate. The transistor includes a source terminal S, a drain terminal D which is electrically connected to the first electrode 17, a channel C connecting the source terminal to the drain terminal and a gate terminal G. The gate terminal G is separated from the channel C by dielectric material which electrically insulates the gate terminal G from the channel C. The source terminal is supplied with an electric potential by a signal line 18, which is illustrated schematically in FIG. 1. The gate terminal G is supplied with an electric potential by a gate signal line GSL. As is known to the skilled person, an electric potential may be applied to the first electrode 17 by applying a suitable electric potential to the gate terminal; this changes a state of the channel from an electrically non-conducting state to an electrically conducting state. Thus, the transistor may be switched to an electrically conducting state so that the electric potential applied to the source terminal may be conducted via the channel to the first electrode. In other words, a flow of electric current between the source terminal and the drain terminal, via the channel, is controllable by application of an electric potential to the gate terminal. In an active matrix configuration, the source terminal may be connected by the signal line to a column driver and the gate terminal may be connected by the gate signal line to a row driver, as will be appreciated by the skilled person, to control the magnitude of and when an electric potential is applied to the first electrode, for controlling a configuration of the fluids.

In the example of FIG. 1, the gate terminal G is formed as a layer of electrically conductive metal on the substrate 7a of the first support plate. A layer of dielectric material DM, for example silicon nitride or silicon dioxide, is formed on the gate terminal G. A layer of semiconducting material is formed as the channel C on the dielectric material DM, the channel at least partly overlapping the gate terminal, with a source terminal and drain terminal each being formed from electrically conductive material. The drain terminal is formed so as to electrically contact the first electrode, for example with part of the drain terminal being formed to overlap part of the first electrode. The source terminal and drain terminal do not contact each other but instead are connected to each other by the channel C, between the drain and source terminals. The barrier layer 16 is then formed on the drain and source terminals and the exposed semiconductor material of the channel C. The channel may be formed of a semiconducting material used to form the first electrode and the drain, source and gate terminals may for example be formed of any of molybdenum (Mo), an alloy including molybdenum (Mo) and chromium (Cr), or aluminum (Al).

In this example, the first support plate includes a reflector R so the display element operates as a reflective display element. A capacitor plate $C_{ST}$ is also part of the first support plate in this example, for forming a storage capacitor with the first electrode 17 acting as the other capacitor plate, separated by the dielectric material DM, the storage capacitor being connected in parallel with the capacitor formed by the first and second electrodes, so that a voltage may be applied between the first and second electrodes for longer after switching the transistor off by removing the electric potential from the gate terminal. The reflector and the capacitor plate $C_{ST}$ are each formed in this example as layers on the substrate 7a of the first electrode. Each of the reflector and capacitor plate are formed for example of any of molybdenum (Mo), an alloy including molybdenum (Mo) and chromium (Cr), or aluminum (Al) and are separated from each other and from the first electrode by the layer of dielectric material DM. In other examples, either or both of the reflector R or the capacitor plate $C_{ST}$ may not be present. In further examples, there may be no reflector R but the capacitor plate $C_{ST}$ may have a greater lateral extent than indicated, by extending laterally so as to be overlapped by a greater extent of the first electrode 17.

The second support plate 6 includes an electrode 19, referred to herein as a second electrode, which may extend between walls of a display element or extend uninterruptedly over a plurality of display elements 2, as shown in the Figure. The electrode 19 is in electrical contact with the second fluid 12 and in this example is common to all display elements. The second electrode in this example is formed as a layer on a surface of the substrate 7b of the second support plate. A second signal line 20 is connected to the second electrode 19. Alternatively, the second electrode may be any element in electrical contact with the second fluid, for applying an electric potential to the second fluid. For example, the second electrode may not be formed as a layer and/or may be arranged at a border of the support plates, where it is in electrical contact with the second fluid. This electrode may be common to all elements, when they are fluidly interconnected by and share the second fluid, uninterrupted by walls. The second electrode in some examples may not form part of either of the first or the second support plates. In other examples, the second electrode may be formed as a pin or multiple elements which are in electrical contact with the second fluid so that an electric potential can be applied to the second fluid. The display element 2 can be controlled by a voltage V applied between the signal lines 18 and 20 and therefore which voltage V is applied between the first electrode and the second fluid. The signal lines 18, 20, GSL may be coupled to a matrix of control lines on the substrate 7a as will be appreciated by the skilled person, with the control lines in turn being coupled to a display driving system for controlling the voltage applied to each display element, to control an image provided by the display device.

The first fluid 11 in this example is confined to one display element by walls 21 that follow the cross-section of the display element. The cross-section of a display element may have any shape; when the display elements are arranged in a matrix form, the cross-section may be square or rectangular. Although the walls are shown as structures protruding from the insulating layer 13, they may instead be at least part of a surface layer of the support plate that repels the first fluid, such as a hydrophilic or less hydrophobic layer. The walls may extend from the first to the second support plate but may instead extend partly from the first support plate to the second support plate as shown in FIG. 1. The extent of the display element, indicated by the dashed lines 3 and 4, is defined by the centre of the walls 21. The area of the surface 14 between the walls of a display element, indicated by the dashed lines 22 and 23, is called the display area 24, over which a display effect occurs. The display effect depends on an extent that the first and second fluids adjoin the surface defined by the display area, in dependence on the magnitude of the applied voltage V described above. The magnitude of the applied voltage V therefore determines the configuration of the first and second fluids within the electrowetting element. In other words, the display effect depends on the configuration of the first and second fluid in the display element, which configuration depends on the magnitude of the voltage applied to the electrodes of the display element. When switching the electrowetting element from one fluid configuration to a different fluid configuration the extent of second fluid adjoining the display area surface may increase or decrease, with the extent of first fluid adjoining the display area surface decreasing or increasing, respectively.

Figure 2:
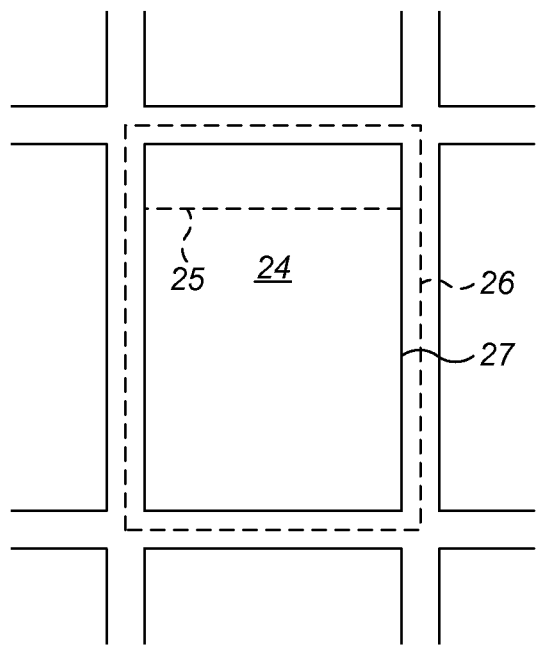
FIG. 2 shows schematically a plan view of a support plate of the display device.

FIG. 2 shows a matrix of rectangular picture elements in a plan view of the hydrophobic surface 14 in FIG. 1 of the first support plate. The lateral extent of the central picture element in FIG. 2, corresponding to the dashed lines 3 and 4 in FIG. 1, is indicated by the dashed line 26. Line 27 indicates the inner border of a wall; the line is also the edge of the display area 24.

In examples described herein, the first fluid adjoins at least part of a surface of the first support plate, this surface being in the present example the surface of the hydrophobic layer 15 which provides the display area 24. When a zero or substantially zero voltage is applied between the electrodes 17 and 19, i.e. when the electrowetting element is in an off state, the first fluid 11 forms a layer between the walls 21, as shown in the FIG. 1. Application of a voltage will contract the first fluid, for example against a wall as shown by the dashed shape 25 in FIG. 1 or FIG. 2. The controllable shape of the first fluid, in dependence on the magnitude of applied voltage, is used to operate the picture element as a light valve, providing a display effect over the display area 24. When applying a voltage to contract the first fluid, the second fluid adjoins at least part of the surface of the first support plate, in this example the display area 24, the size of area of second fluid adjoinment depending on the extent of first fluid contraction. Thus, when applying a voltage to contract the first fluid, the second fluid displaces part of the first fluid adjoining the surface and in doing so moves the first fluid to the contracted form.

For example, switching the fluids to increase adjoinment of the second fluid with the display area may increase the brightness of the display effect provided by the element.

This display effect determines the display state an observer will see when looking towards the viewing side of the display device. The display state can be from black to white with any intermediate grey state; in a colour display device, the display state may also include colour.

It is known to form at least one of the first and second electrodes from indium tin oxide (ITO). ITO is a material commonly used as an electrode material in electrowetting elements, as it can be formed as a layer with a suitable optical transparency and with a suitable electrical conductivity.

It has now been identified by the inventor that using ITO to form one or both of the first and second electrodes is problematic. For example, to form either of the first and second electrodes in a known device, a layer of ITO is commonly formed using a physical vapour deposition (PVD) technique, for example sputtering, such as RF (radio-frequency) sputtering which involves bombarding the target material to be sputtered with a glow plasma discharge, causing a vapour of the material to be formed for subsequent deposition on the substrate on which the ITO layer is to be formed. PVD, for example sputtering, can lead to a layer of ITO being formed which does not have a uniform thickness and/or which does not have a smooth surface, on which additional layers may be formed. Moreover, the ITO layer may be porous. This non-uniformity and lack of a smooth, i.e. substantially planar, surface may be due to irregular deposition of the ITO owing to poor control of the sputter deposition parameters. Thus, in the case of the first electrode, layers applied on the ITO layer, for example a barrier layer or a hydrophobic layer explained above may undesirably be contaminated with randomly dispersed ITO particles of varying diameter protruding from the surface of the ITO layer. This can lead to defects in the layers applied on the ITO layer, for example a defect in the barrier layer and/or hydrophobic layer which may permit the first or second fluid to penetrate the hydrophobic and barrier layers to reach the first electrode. Further, when applying a layer such as the barrier layer and/or the hydrophobic layer on the irregular surface of the ITO layer, the resulting barrier and/or hydrophobic layers may also have an irregular surface or a non-uniform thickness. These defects and irregularities have been noted to reduce a lifetime of the display element and to influence the fluid switching performance of the display element due to the effects on the strength of the electric field caused by a non-uniform thickness dielectric material between the fluids and the first electrode.

A requirement of the material from which either or both of the first and second electrodes is formed includes a suitable electrical conductivity, so that a voltage can be applied between the first and second electrodes for correct switching of the fluids. Depending on the construction of the display element, the material may also need a suitable optical transparency.

It has now been identified by the inventor that in examples at least one of these problems may be overcome by forming at least one of the first and second electrodes from a semiconducting material, i.e. a semiconductor. Therefore both the first and the second electrodes may be formed of a semiconducting material.

The properties of a semiconducting material depend on the semiconducting material in question, but in general a semiconductor has, at a given temperature, a greater electrical conductivity than an electrical insulator and a lower electrical conductivity than an electrical conductor such as a metal. The extent of electrical conductivity may be due to the number of free electrons and/or electron holes in the semiconducting material, which are not used in atomic bonds between the atoms of the semiconducting material. As examples, a metal such as aluminum has an electrical conductivity of 5.961E7 Siemens, a semiconductor such as low temperature poly silicon has an electrical conductivity of 1.56-E-3 Siemens and an insulator such as Teflon has an electrical conductivity of 10E-16 Siemens. Each of these values are given for room temperature and standard atmospheric pressure, defined below.

The electrical conductivity of a semiconducting material at a given temperature may be adjusted by introducing atoms of a different element or material into the semiconducting material. This technique is called doping and can increase the number of free electrons and/or electron holes for conducting electricity. A doped semiconducting material may be referred to as an extrinsic semiconducting material.

It is noted that ITO is formed of indium oxide which for the purposes of forming an electrode of a display element is commonly doped with tin to the extent that the ITO shows a metallic level of electrical conductivity, i.e. an electrical conductivity indicative of a metal, rather than an electrical conductivity characteristic of a semiconductor. Therefore, ITO is not considered to be a semiconductor, although it is noted that in the art ITO may be referred to as a degenerate semiconductor. A degenerate semiconductor may be considered in examples to be a semiconductor material which has been doped to the extent that it no longer shows electrical conductivity properties of a semiconductor, but instead has an electrical conductivity characteristic of a metal. Therefore, in examples described herein, at least one of the first and second electrodes may be formed of a non-degenerate semiconducting material, i.e. a semiconducting material which is not degenerate; in some such examples, the semiconducting material may be an extrinsic semiconducting material which is non-degenerate, meaning that the semiconducting material has been doped but not to the extent that the semiconducting material has a metallic level of electrical conductivity. For the sake of clarity, the definition of a semiconducting material herein excludes ITO.

In other examples, the semiconducting material is an intrinsic semiconducting material. An intrinsic semiconducting material in examples is a material which is not doped, i.e. is undoped and which has an electrical conductivity characteristic of a semiconductor. Therefore, an intrinsic semiconducting material may also be a non-degenerate semiconducting material. In some examples, an intrinsic semiconducting material may also be one of a non-metallic semiconducting material, an organic polymer, or a material including at least one metalloid element, which are described in further detail below. An example of an intrinsic semiconducting material is microcrystalline silicon or polysilicon such as low temperature polysilicon (LTPS), which are explained in examples further below. Other examples of an intrinsic semiconducting material for forming at least one of the first and second electrodes includes: gallium based semiconducting materials, for example indium gallium zinc oxide (IGZO) with for example a stack of layers of alternating indium oxide and gallium zinc oxide, each layer having a thickness in the order of tens of nanometers and including microcrystalline grains; organic polymer semiconducting materials, for example polyfluorene or poly(methyl methacrylate) (PMMA), or graphene.

In examples where a semiconducting material for forming at least one of the first and second electrodes does not include a metal, i.e. the semiconducting material is for example non-metallic, for example if the semiconducting material is instead formed of at least one metalloid element, which exhibits both metal and non-metal properties, such as silicon, a cleaner and more controllable deposition technique than PVD (for example sputtering), may be used to form at least one of the first and second electrodes. For example, a chemical vapour deposition (CVD) technique may be used such as plasma enhanced chemical vapour deposition (PECVD) or low pressure CVD (LPCVD). Chemical vapour deposition is more difficult to use where the material to be deposited includes a metal, as the gases required can be toxic and difficult to generate. However, where the semiconducting material does not include a metal, for example where the semiconducting material is polysilicon for example LTPS or microcrystalline silicon, CVD techniques are more accessible and offer a cleaner and more controllable deposition technique than PVD. Thus, less contamination and greater surface uniformity of the electrode may be introduced into a display element, meaning that the quality of the electrode formation is improved. Thus, where for example the first electrode is formed using PECVD, a thickness T1 of the first electrode (indicated for the example in FIG. 1 as a thickness between a first substantially planar surface S1 adjoining the barrier layer 16 and a second substantially planar surface S2 which is substantially parallel to the first substantially planar surface S1 and which adjoins the dielectric layer DM between the reflector R and the first electrode, the thickness being defined in a direction perpendicular to a plane of one of the substantially planar surfaces) may be more uniform across the lateral extent of the first electrode. Thus, the hydrophobic layer may have a more uniform thickness too, along with fewer surface asperities, resulting in a more planar surface 14 adjoining the first fluid, which gives improved switching performance. Further, with the reduced contamination, there may be fewer or no defects in the barrier and/or hydrophobic layers, which can improve performance and the lifetime of the display by for example reducing the presence of channels through which the first and/or second fluids can contact the first electrode. Further, CVD techniques can form a thinner and denser layer of first electrode material than PVD techniques. Therefore, with a thinner first electrode, less material is required, which can reduce the cost of manufacturing the display element and which can increase the optical transparency of the first electrode, thus improving the brightness of a display effect of the display element. Further, a polysilicon, such as LTPS, first electrode may provide a similar electrical conductivity to an ITO first electrode and therefore may provide comparable switching performance for the display element. In addition the same semiconducting material may be used for the first electrode and the channel of the transistor, despite the different functions of the channel and the first electrode.

In examples where at least one of the first and second electrodes is formed of a polyfluorene compound, the polyfluorene may be deposited using electrodeposition or an electrochemical or electropolymerisation process, or in other examples using spin coating or CVD. In other examples where at least one of the first and second electrodes is formed of PMMA, emulsion polymerisation, solution polymerisation, or bulk polymerisation may be used as a process for forming the PMMA, for example as thin film on a surface; CVD may be used in other examples.

It is believed that using a material with an electrical conductivity of a metal, for example a degenerate semiconductor, to form at least one of the first electrode and the second electrode may influence the lifetime of the display device, for example if the second fluid was to come into contact with the ITO material of either of the first and second electrodes of known electrowetting display elements. Forming at least one of the first and second electrodes of polysilicon for example LTPS or microcrystalline silicon, may in examples improve the lifetime of the display device.

In examples, at least one of the first electrode and the second electrode is formed of a semiconducting material comprising one or more of polycrystalline, low-temperature polycrystalline silicon (LTPS), single crystal silicon or microcrystalline silicon. In microcrystalline silicon, which may otherwise be referred to as nanocrystalline silicon, there are grains of crystalline silicon, i.e. regions where the silicon atoms form a crystal lattice, which are distributed within one or more regions of amorphous silicon, i.e. a region of non-crystalline silicon where silicon atoms do not form a crystal lattice. In single crystal silicon all of the silicon atoms form a single continuous crystal lattice, i.e. for example with no regions of different orientations of crystal lattice compared with other regions. Polycrystalline silicon, which may otherwise be referred to as polysilicon, is formed predominantly, for example entirely, of regions of crystalline silicon; within each region, which may otherwise be referred to as a grain, the silicon forms a single crystal lattice, but the orientation of the crystal lattice of one region may not align with the orientation of the crystal lattice of an adjacent region; each region may for example have a maximum dimension of 0.3 to 5 micrometers. LTPS is an example of polycrystalline silicon formed using a low temperature annealing process to form the regions of crystalline silicon when starting with amorphous silicon. An example will be described below.

In examples where at least one of the first and second electrodes is formed of polysilicon, for example LTPS, the polysilicon has a sheet resistance in the range of about 50 to 100,000 Ohm/square. Use of the term "about" denotes a variation of the sheet resistance values given here, within manufacturing tolerances for example; in some examples there is no such variation. For example LTPS may in examples have a sheet resistance of 70 Ohm/square. The sheet resistance is a measure known to the skilled person of a resistance of a thin film of a material. The values given here are taken at standard atmospheric pressure of 760 torr at room temperature, i.e. 20 degrees Celsius, which sheet resistance values may be measured using a multimeter instrument using a four point probe.

In examples, the channel C illustrated in FIG. 1 is formed of a layer of one of the semiconducting materials listed above and the first electrode is formed of a layer of similar or the same semiconducting material as that the channel is formed of. The channel in this example has a thickness T2 (indicated for the example in FIG. 1 as a thickness between a first substantially planar surface S3 adjoining part of the barrier layer 16 and a second substantially planar surface S4, which is substantially parallel to the first substantially planar surface S3 and which adjoins the dielectric layer DM between the gate terminal G and the channel C, the thickness being defined in a direction perpendicular to a plane of one of the substantially planar surfaces), where the thickness T2 is substantially the same as the thickness T1 of the first electrode. Use of the term substantially herein in examples in relation to substantially parallel, substantially planar and substantially the same may be taken to account for differences introduced by manufacturing techniques. Therefore, for example, two planar surfaces may be substantially parallel if they are parallel to each other within acceptable manufacturing tolerances. Substantially planar may be taken to mean that a surface is generally planar, i.e. that a surface is predominantly planar, taking into account manufacturing tolerances. The thickness T1 of the first electrode and the thickness T2 of the channel C may for example be in the range of one or more of: about 25 to 200 nanometers, about 25 to 150 nanometers, about 25 to 100 nanometers, about 25 to 75 nanometers, or about 25 to 50 nanometers. Use of the term "about" denotes a variation of the thickness values given here, within manufacturing tolerances for example; in some examples there be no such variation.

In examples where the first electrode is formed of the same semiconducting material as the channel, the channel and the first electrode may be formed using the same deposition technique, for example PECVD where for example the semiconducting material is LTPS. In further examples, the first electrode and the channel may therefore be formed simultaneously, i.e. when the first electrode is formed the channel may be formed too, using the same deposition technique. Thus, manufacture of the first support plate may be simplified as the channel and the first electrode can be formed in one processing step, for example by forming the channel and the first electrode on a layer of dielectric material which for example forms the layer of dielectric material DM separating the gate terminal from the channel. Example deposition techniques include one or more of CVD, PECVD or PVD, depending on the semiconducting material. As explained above, CVD and PECVD offer a cleaner technique and provide a substantially planar surface than PVD. The deposition technique used for forming the electrode and/or channel may be detected in a display element using for example high resolution microscopy techniques such as transmission electron microscopy or scanning transmission electron microscopy. For example, a layer of material formed by PECVD may demonstrate a different structure, for example of a higher density, than a layer of material formed by PVD, which for example may be more porous with a larger grain size. Analysis of the material structure can be used to detect the deposition technique. Thus, the deposition structure, i.e. the structure of the material resulting from the deposition technique used, may be identified and used to indicate the deposition technique used.

Figure 3:
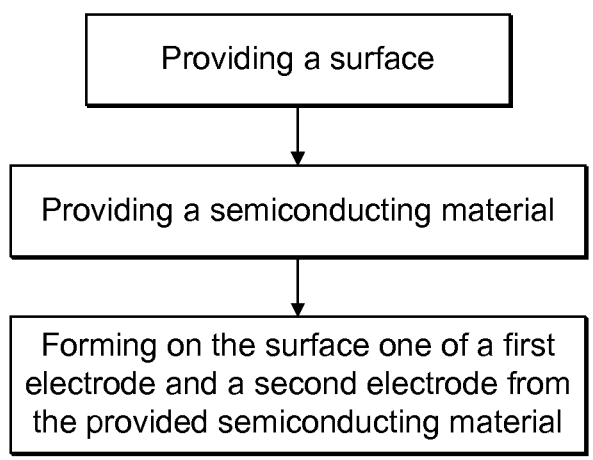
FIG. 3 shows a flow chart relating to an example method of manufacturing a support plate of an electrowetting device.

In examples, for example to form the first support plate illustrated in FIG. 1, the gate terminal G, the reflector and the storage capacitor plate $C_{ST}$ are deposited on a surface of a substrate using for example a PVD technique such as sputtering, with an appropriate mask, as would be appreciated by the skilled person. A layer of the dielectric material DM may then be formed for example using a CVD technique. With reference to FIG. 3, a surface may be provided followed by providing a semiconducting material from which is formed one of the first electrode and the second electrode. Therefore, in an example, a surface of the layer of the dielectric material DM provides a surface on which is then formed the first electrode from the semiconducting material. In examples the channel may be formed on the surface from the same semiconducting material, for example using the same deposition technique. In examples where the semiconducting material is polysilicon, a layer of amorphous silicon is first formed, for example as the skilled person will understand, using a CVD technique such as PECVD or LPCVD, at a temperature in the range of 250 to 400 degrees Celsius and for example for PECVD at a pressure of for example 1 torr. The silicon may be deposited at a deposition rate of about 160 A/minute, where A is Angstrom, for deposition on a surface having a surface area of approximately 150 or 160 millimeters square. Appropriate masking may be used to form layers of amorphous silicon to round form the channel and the first electrode. In alternative examples PVD may be used to deposit, for example by sputtering, amorphous silicon. Once the layers of amorphous silicon are formed, they are for example annealed using a laser annealing treatment, as would be known to the skilled person, to transform the amorphous silicon to polysilicon. As the laser annealing treatment does not use high temperatures, the resulting polysilicon is LTPS. Alternatively, a solid phase crystallisation (SPC) technique may be used to transform the amorphous silicon to polysilicon. Once the polysilicon, such as LTPS, is formed, the source and drain terminals may be formed, for example by PVD, followed by forming the insulating layer thereon, which may involve forming the barrier layer using CVD for example, followed for example by spin coating a layer of the hydrophobic material thereon. Finally, the walls may be formed on the hydrophobic layer, thus completing manufacture of the first support plate.

Separately, referring to FIG. 3, the second support plate may be manufactured by for example providing a substrate and forming a layer of semiconducting material on a surface of the substrate, to form the second electrode. The second electrode may be formed of polysilicon, such as LTPS and may for example be formed using PECVD followed by laser annealing as described above for forming the first electrode.

To assemble the electrowetting display device, the first support plate and the second support plate may be joined together, using a sealing member, with the first fluid and the second fluid having been provided between the first and second support plates, as would be readily appreciated by the skilled person.

The above examples are to be understood as illustrative examples. Further examples are envisaged. For example, an electrode formed of a semiconducting material may be used in any electrowetting device for providing a display effect or which modifies a characteristic of a beam of light. It is to be understood that any feature described in relation to any one example may be used alone, or in combination with other features described and may also be used in combination with one or more features of any other of the examples, or any combination of any other of the examples. Furthermore, equivalents and modifications not described above may also be employed without departing from the scope of the accompanying claims.

What is claimed is:

1. An electrowetting display device including an electrowetting element comprising:
   a first support plate and a second support plate;
   a first fluid and a second fluid disposed between the first support plate and the second support plate, the first fluid being immiscible with the second fluid;
   a first electrode located in the first support plate and a second electrode in electrical contact with the second fluid, for applying a voltage between the first electrode and the second fluid,
   wherein at least one of the first electrode or the second electrode comprises a semiconducting material.

2. An electrowetting display device according to claim 1, wherein the semiconducting material is at least one: an intrinsic semiconducting material, a non-degenerate semiconducting material, a non-metallic semiconducting material, an organic polymer, or a material including at least one metalloid element.

3. An electrowetting display device according to claim 1, wherein the semiconducting material is at least one of: a semiconducting material including gallium, indium gallium zinc oxide, a polyfluorene polymer, poly(methyl methacrylate), or graphene.

4. An electrowetting display device according to claim 1, wherein the semiconducting material comprises at least one of: polycrystalline silicon, low-temperature polycrystalline silicon, or microcrystalline silicon.

5. An electrowetting display device according to claim 1, wherein the semiconducting material comprises polycrystalline silicon with a sheet resistance in the range of about 50 to 100,000 Ohm/square.

6. An electrowetting display device according to claim 1, wherein the first electrode comprises a layer of the semiconducting material having two substantially planar surfaces substantially parallel to each other, a thickness of the layer of the semiconducting material in a direction perpendicular to a plane of one of the substantially planar surfaces being in a range of one of: about 25 to 200 nanometers, about 25 to 150 nanometers, about 25 to 100 nanometers, about 25 to 75 nanometers, or about 25 to 50 nanometers.

7. An electrowetting display device according to claim 1, wherein the first support plate includes a transistor for controlling application of an electric potential to the first electrode, the transistor including a source terminal, a drain terminal electrically connected to the first electrode, a channel connecting the source terminal to the drain terminal, and a gate terminal separated from the channel by a dielectric material, a flow of electric current between the source terminal and the drain terminal, via the channel, being controllable by application of an electric potential to the gate terminal, wherein the channel comprises the semiconducting material.

8. An electrowetting display device according to claim 7, wherein the channel comprises a first layer of the semiconducting material and the first electrode comprises a second layer of the semiconducting material, each of the first layer and the second layer having two substantially planar surfaces substantially parallel to each other, a thickness of each of the first layer and the second layer being substantially the same in a direction perpendicular to a plane of one of the substantially planar surfaces.

9. An electrowetting display device according to claim 8, wherein the thickness of each of the first layer and the second layer is in the range of one of: about 25 to 200 nanometers, about 25 to 150 nanometers, about 25 to 100 nanometers, about 25 to 75 nanometers, or about 25 to 50 nanometers.

10. An electrowetting display device according to claim 7, the first electrode comprising the semiconducting material, wherein a deposition structure of the semiconducting material of the channel and of the first electrode is substantially the same.

11. An electrowetting display device according to claim 7, the first electrode comprising the semiconducting material, wherein the first electrode and the channel are formed using at least one of: chemical vapour deposition, plasma enhanced chemical vapour deposition, or physical vapour deposition.

12. An electrowetting display device according to claim 7, the first electrode comprising the semiconducting material, the first support plate including a layer comprising the dielectric material and having a surface on which the channel and the first electrode are positioned, wherein at least part of the layer comprising the dielectric material separates the gate terminal from the channel.

13. An electrowetting display device according to claim 1, the first support plate including a fluid adjoinment layer positioned on a surface of the first electrode and having a surface for adjoining the first fluid, the fluid adjoinment layer comprising a material with a greater wettability for the first fluid than for the second fluid upon application of a substantially zero voltage between the first and the second electrodes.

14. An electrowetting display device according to claim 1, the second support plate including a substrate with a surface on which the second electrode is positioned, the second electrode comprising the semiconducting material.

15. An electrowetting display device according to claim 14, the second electrode comprising a layer on the surface of the substrate.

16. A method of manufacturing an electrowetting element, the method comprising:

depositing a semiconducting material on at least one of a first support plate surface or a second support plate surface;

forming at least one of a first electrode on the first support plate surface or a second electrode on the second support plate surface from the semiconducting material deposited respectively on the at least one of the first support plate surface or the second support plate surface; and disposing a first fluid and a second fluid between a first support plate having the first support plate surface and a second support plate having the second support plate surface, the first fluid being immiscible with the second fluid.

17. A method according to claim 16 comprising:

forming the first electrode from the semiconducting material deposited on the first support plate surface; and forming a channel from the semiconducting material deposited on the first support plate surface, for connecting a source terminal to a drain terminal of a transistor.

18. A method according to claim 17, the forming the first electrode and the forming the channel comprising at least one of: chemical vapour deposition, plasma enhanced chemical vapour deposition, or physical vapour deposition.

19. A method according to claim 17, comprising the forming the first electrode during the forming the channel, using the same deposition technique.

20. A first support plate for an electrowetting display device including an electrowetting element comprising:

the first support plate and a second support plate;

a first fluid and a second fluid disposed between the first support plate and the second support plate, the first fluid being immiscible with the second fluid;

a first electrode located in the first support plate and a second electrode in electrical contact with the second fluid, for applying a voltage between the first electrode and the second fluid, wherein the first support plate includes the first electrode which comprises a semiconducting material.

* * * * *